(12) United States Patent
Li et al.

(10) Patent No.: US 10,658,316 B2
(45) Date of Patent: May 19, 2020

(54) BOND PAD RELIABILITY OF SEMICONDUCTOR DEVICES

(71) Applicant: GLOBALFOUNDRIES Singapore Pte. Ltd., Singapore (SG)

(72) Inventors: Xiaodong Li, Singapore (SG); Juan Boon Tan, Singapore (SG); Ramasamy Chockalingam, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/150,242

(22) Filed: Oct. 2, 2018

(65) Prior Publication Data

US 2020/0105690 A1   Apr. 2, 2020

(51) Int. Cl.

| H01L 23/48 | (2006.01) |
|---|---|
| H01L 23/00 | (2006.01) |
| H01L 23/482 | (2006.01) |
| H01L 23/485 | (2006.01) |
| H01L 23/31 | (2006.01) |
| H01L 21/768 | (2006.01) |
| H01L 23/532 | (2006.01) |
| H01L 21/28 | (2006.01) |
| H01L 21/3065 | (2006.01) |

(52) U.S. Cl.
CPC ........ *H01L 24/05* (2013.01); *H01L 21/28247* (2013.01); *H01L 21/30655* (2013.01); *H01L 21/76802* (2013.01); *H01L 23/3178* (2013.01); *H01L 23/485* (2013.01); *H01L 23/4824* (2013.01); *H01L 23/53223* (2013.01); *H01L 23/53238* (2013.01)

(58) Field of Classification Search
CPC ............. H01L 21/768; H01L 21/28247; H01L 21/30655; H01L 23/4824; H01L 23/53223
See application file for complete search history.

(56) References Cited

U.S. PATENT DOCUMENTS

| 5,597,766 A | 1/1997 | Neppl |
| 2006/0068567 A1 | 3/2006 | Beyne et al. |
| 2007/0087524 A1 | 4/2007 | Montgomery |
| 2013/0099380 A1* | 4/2013 | Chen ........................ H01L 24/11 257/738 |
| 2014/0252601 A1* | 9/2014 | Lu ..................... H01L 21/76885 257/737 |

* cited by examiner

*Primary Examiner* — Phuc T Dang
(74) *Attorney, Agent, or Firm* — David Cain (57) ABSTRACT

According to an aspect of the present disclosure, a semiconductor device is provided that includes a substrate, at least one bond pad, a passivation layer and a NBLoK layer. The bond pad is formed over the substrate. The passivation layer is deposited over the substrate and has an opening defined by end portions of the passivation layer over the bond pad. The NBLoK layer is covering the end portions of the passivation layer.

14 Claims, 8 Drawing Sheets

BOND PAD RELIABILITY OF SEMICONDUCTOR DEVICES

FIELD OF THE INVENTION

The presently disclosed subject matter relates generally to a method of improving bond pad reliability of semiconductor devices, and more particularly to a method of reducing contamination on bond pad surfaces of semiconductor devices.

BACKGROUND

In semiconductor device fabrication, various layers of insulating material, semiconducting material and conducting material are patterned to create features that form semiconductor components, such as transistors, capacitors and resistors. These semiconductor components are interconnected to achieve their intended function, thereby forming an integrated circuit (IC) device. The IC device (chip) will additionally include bond pads for forming interconnections with external packaging components; for example, a printed circuit board through wire bonding or flip-chip bonding. Bond pads are typically made from a conductive material, such as aluminum (Al) or copper (Cu).

After fabrication of the IC devices is completed, passivation layers are formed on the IC devices to protect chip surfaces from mechanical damage and to prevent moisture build-up and penetration into the IC devices. Moisture penetration into IC devices may cause adverse effects that include, but not limited to, corrosion, reduction of bulk resistivity and electrical polarization effects. The passivation layers have openings over the bond pads for the bonding wires or solder bumps to be subsequently connected.

One of the challenges in forming the bond pad openings in the passivation layer is fluorine contamination from etch chemicals used in the plasma etching process. The plasma etching process is typically performed in a fluorine-containing gases environment; for example, hydrofluorocarbon ($CHF_3$). Residual fluorine may remain predominantly on end portions of the passivation layer at the bond pad openings as adhesive-like contaminants, i.e., fluorine polymers.

The issue of fluorine contamination is particularly challenging for Al bond pads, because, over time (e.g., a period of storage of IC devices), the fluorine polymers may discharge fluorine contaminants, which will corrode the bond pad surfaces and/or form fluorinated Al crystallites on the bond pad surfaces. As a result, IC devices may exhibit higher failure rate or performance degradation due to reduced adhesion of the bonding wires or solder bumps to the bond pad surface.

SUMMARY

As described above, there are several challenges in keeping bond pad surfaces substantially contamination-free and it is, therefore, desirable to provide a method to improve bond pad reliability of semiconductor devices.

To achieve the foregoing and other aspects of the present disclosure, a method to improve bond pad reliability of semiconductor devices is presented.

According to an aspect of the present disclosure, a semiconductor device is provided that includes a substrate, at least one bond pad, a passivation layer and a NBLoK layer. The bond pad is formed over the substrate. The passivation layer is deposited over the substrate and has an opening defined by end portions of the passivation layer over the bond pad. The NBLoK layer is covering the end portions of the passivation layer.

According to another aspect of the present disclosure, a semiconductor device is provided that includes a substrate, at least one bond pad, a passivation layer, a cap, a trench and a NBLoK layer. The bond pad is formed over the substrate. The passivation layer is deposited over the substrate and has an opening defined by end portions of the passivation layer over the bond pad. The cap is covering the end portions of the passivation layer at the opening. The trench, positioned at a perimeter of the semiconductor device, has sidewalls and the NBLoK layer lining the trench sidewalls.

According to yet another aspect of the present disclosure, a method of fabricating a semiconductor device is provided, that includes a substrate and forming at least one bond pad over the substrate. A passivation layer is deposited over the bond pad and over the substrate, with an opening defined by end portions of the passivation layer that exposes the bond pad. A first NBLoK layer is deposited over the passivation layer and its end portions and over the bond pad. A trench having sidewalls is formed at a perimeter of the semiconductor device. A second NBLoK layer is deposited over the first NBLoK layer and lining the trench. The first and second NBLoK layers are removed to expose the bond pad and forms caps over the sidewalls of the passivation layer.

BRIEF DESCRIPTION OF THE DRAWINGS

The embodiments of the present disclosure will be better understood from a reading of the following detailed description, taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the device. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The following detailed description is exemplary in nature and is not intended to limit the device or the application and uses of the device. Furthermore, there is no intention to be bound by any theory presented in the preceding background of the device or the following detailed description.

The present disclosure relates to a method of improving bond pad reliability by containing fluorine polymers after forming openings in a passivation layer over bond pads and reducing contamination on bond pad surfaces. Aspects of the present disclosure are now described in detail with accompanying figures. It is noted that like and corresponding elements are referred to by like reference numerals.

A method is disclosed for improving bond pad reliability of a semiconductor device by sealing end portions of a passivation layer with a protective layer of dielectric material, wherein the end portions of the passivation layer define a bond pad opening. The protective layer of dielectric material may be deposited over a bond pad surface to protect the bond pad surface from further processing steps, such as a deep trench formation, without causing additional contamination to the bond pad surface.

Figure 1A:
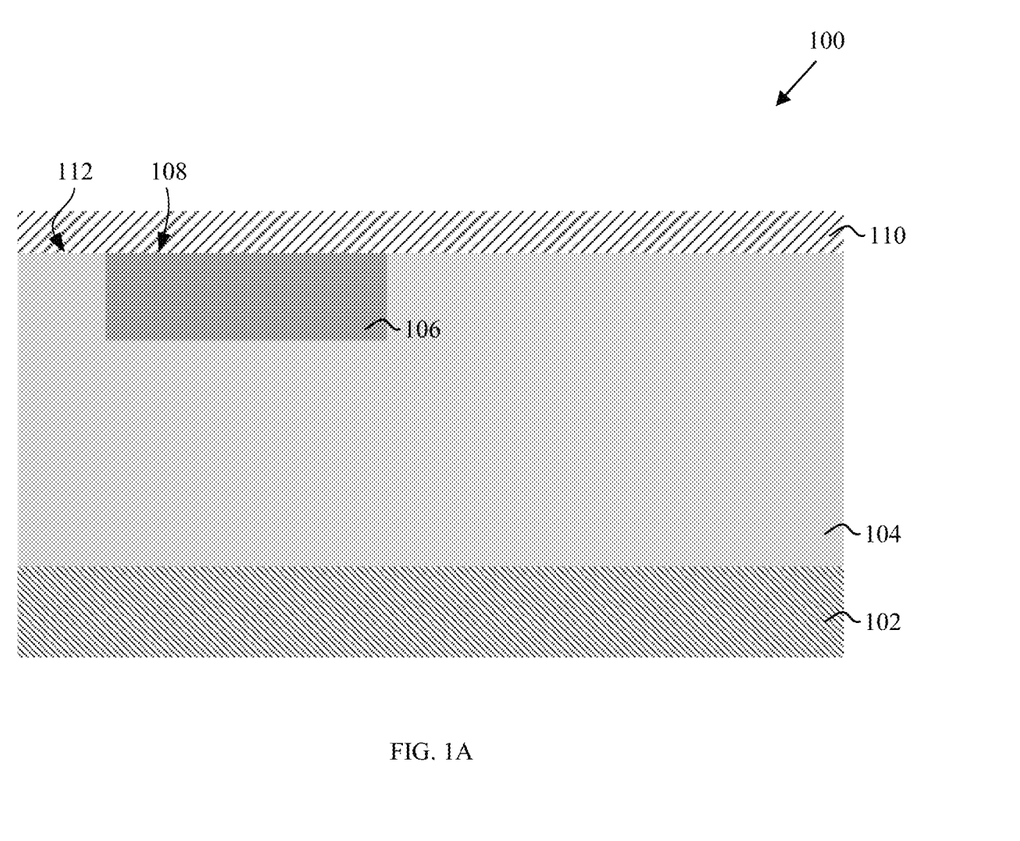
FIGS. 1A-1C are cross-sectional views of a semiconductor device depicting a method of improving bond pad reliability, according to an embodiment of the disclosure.
Figure 1B:
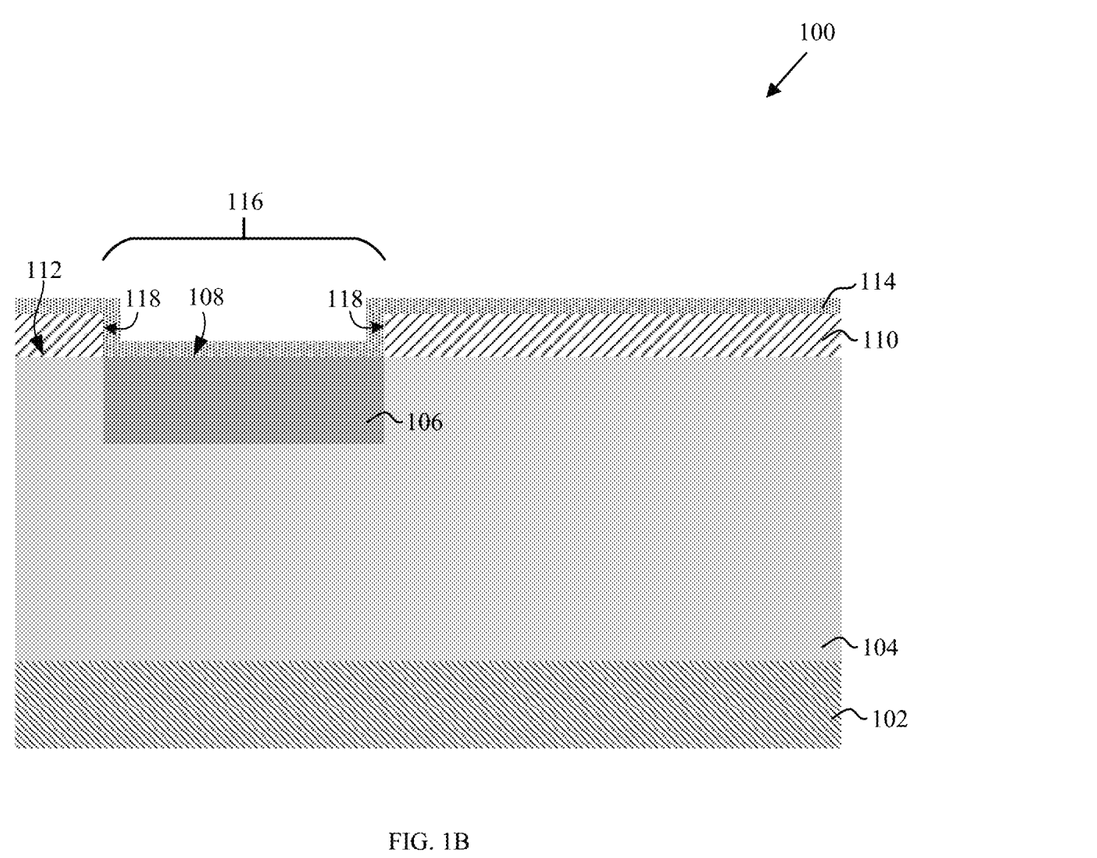
Figure 1C:
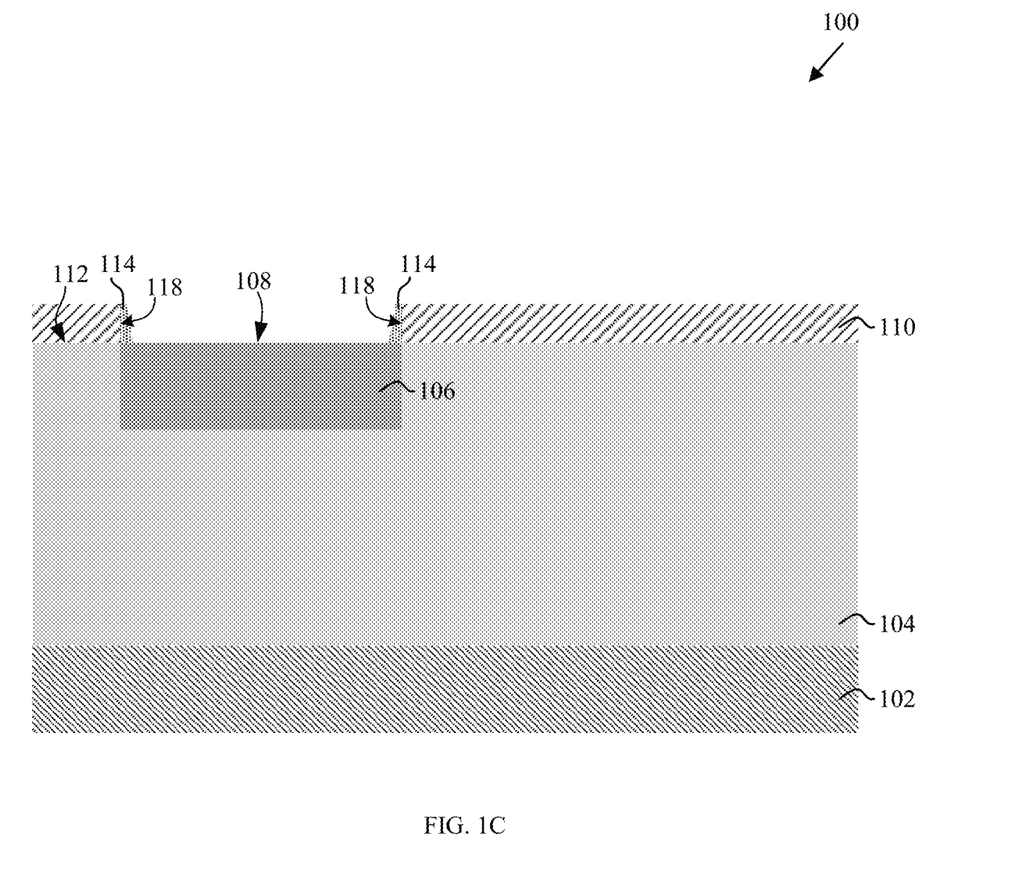

FIGS. 1A-1C are cross-sectional views of a semiconductor device 100, according to an embodiment of the present disclosure. FIGS. 1A-1C illustrate the method of improving bond pad reliability of semiconductor devices by sealing end portions of a passivation layer over a bond pad surface. Certain structures may be conventionally fabricated, for example, using known processes and techniques and specifically disclosed processes and methods may be used to achieve individual aspects of the present disclosure.

FIG. 1A is a cross-sectional view of an embodiment of the semiconductor device 100 that is fabricated on a semiconductor substrate 102. The semiconductor substrate 102 may include of any appropriate semiconductor material, such as silicon, silicon/germanium, silicon/carbon, other II-VI or III-V semiconductor compounds and the like. The semiconductor substrate 102 may be made of silicon or it may be made of materials other than silicon, for example, gallium arsenide, gallium phosphate or germanium. Thus, the terms "substrate" or "semiconductor substrate" should be understood to cover all typically used semiconducting materials and all forms of such materials. The semiconductor components and interconnects are not shown for clarity.

As illustrated in FIG. 1A, the semiconductor device 100 includes the semiconductor substrate 102, a dielectric layer 104, a bond pad 106 with an upper surface 108 and a passivation layer 110. The bond pad 106 is fabricated in the dielectric layer 104, with the upper surface 108 of the bond pad 106 being coplanar with an upper surface 112 of the dielectric layer 104. The passivation layer 110 is deposited over the upper surface 112 of the dielectric layer 104 and over the upper surface 108 of the bond pad 106. In one embodiment of the disclosure, the bond pad 106 is made from a conductive material, such as aluminum (Al) or copper (Cu) and the dielectric layer 104 is made from a dielectric material having an ultra-low dielectric constant.

FIG. 1B illustrates the semiconductor device 100 after depositing a nitrogen-doped barrier low-k (NBLoK) layer 114. A bond pad opening process is performed, i.e. a portion of the passivation layer 110 is removed by conventional photolithographic and plasma etching processes to form a bond pad opening 116 over the upper surface 108 of the bond pad 106. The bond pad opening 116 is defined by end portions 118 of the passivation layer 110 and may have a same width or a smaller width as the bond pad 106. The plasma etching process is performed in fluorine-containing gases, such as hydrofluorocarbon ($CHF_3$). These fluorine-containing gases often leave residues as adhesive-like contaminants, i.e. fluorine polymers, on the end portions 118 of the passivation layer 110 and on the upper surface 108 of the bond pad 106. These fluorine polymers may be challenging to remove by subsequent cleaning step or steps.

The NBLoK layer 114 is deposited conformally over the passivation layer 110 and its end portions 118 and over the upper surface 108 of the bond pad 106. In one embodiment of the disclosure, the NBLoK layer 114 is made of a dielectric material that includes silicon carbonitride (SiCN), silicon oxynitride (SiON), silicon nitride ($Si_xN_y$) or silicon oxide ($SiO_2$), wherein x and y are in stoichiometric ratio. The NBLoK layer 114 has a preferred thickness in a range of 50 Å to 200 Å. In another embodiment of the disclosure, the preferred material of the NBLoK layer 114 is SiCN and the NBLoK layer 114 has a preferred thickness of 70 Å.

FIG. 1C illustrates the semiconductor device 100 after removing portions of the NBLoK layer 114. The NBLoK layer 114 is anisotropically removed using conventional plasma etching process, exposing the upper surface 108 of the bond pad 106. Due to the intrinsic nature of the plasma etch process, the NBLoK layer 114 is removed from all upper surfaces, leaving portions of the NBLoK layer 114 on the end portions 118 of the passivation layer 110. The remaining portions of the NBloK layer 114 have a tapered surface, wherein the tapered surface is tapered in a direction such that a lower portion of the NBLoK layer 114 has a wider width than at an upper portion. The remaining portions of the NBLoK layer 114 form protective caps over the end portions 118 of the passivation layer 110, sealing the formed fluorine polymers from the bond pad opening process between the end portions 118 of the passivation layer 110 and the NBLoK layer 114. In one embodiment of the disclosure, the portion of the NBLoK layer 114 remaining on the sidewalls 118 of the passivation opening 116 has a width in a range of 50 Å to 125 Å.

FIGS. 2A-2D are cross-sectional views of a semiconductor device 200, according to another embodiment of the present disclosure. FIGS. 2A-2D illustrate a method of improving bond pad reliability of semiconductor devices for post fabrication processes, such as a deep trench formation.

Figure 2A:
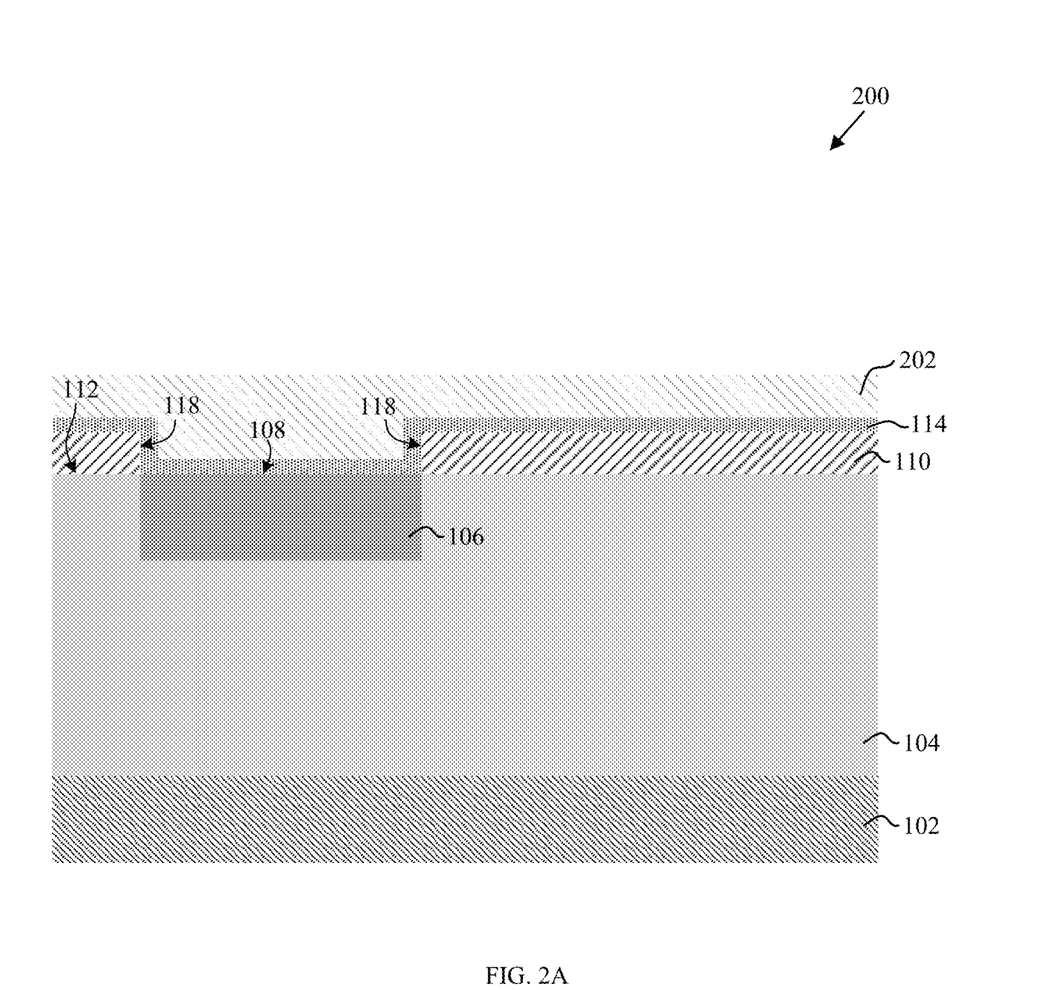
FIGS. 2A-2D are cross-sectional views of a semiconductor device depicting a method of improving bond pad reliability, according to another embodiment of the disclosure.

FIG. 2A illustrates the semiconductor device 200 after depositing a layer of photoresist 202 over the NBLoK layer 114. The deposition of the NBLoK layer 114 has been described in FIG. 1B and hereinafter will be referred to as "first NBLoK layer". The first NBLoK layer 114 protects the upper surface 108 of the bond pad 106 from being in direct contact with the layer of photoresist 202.

Figure 2B:
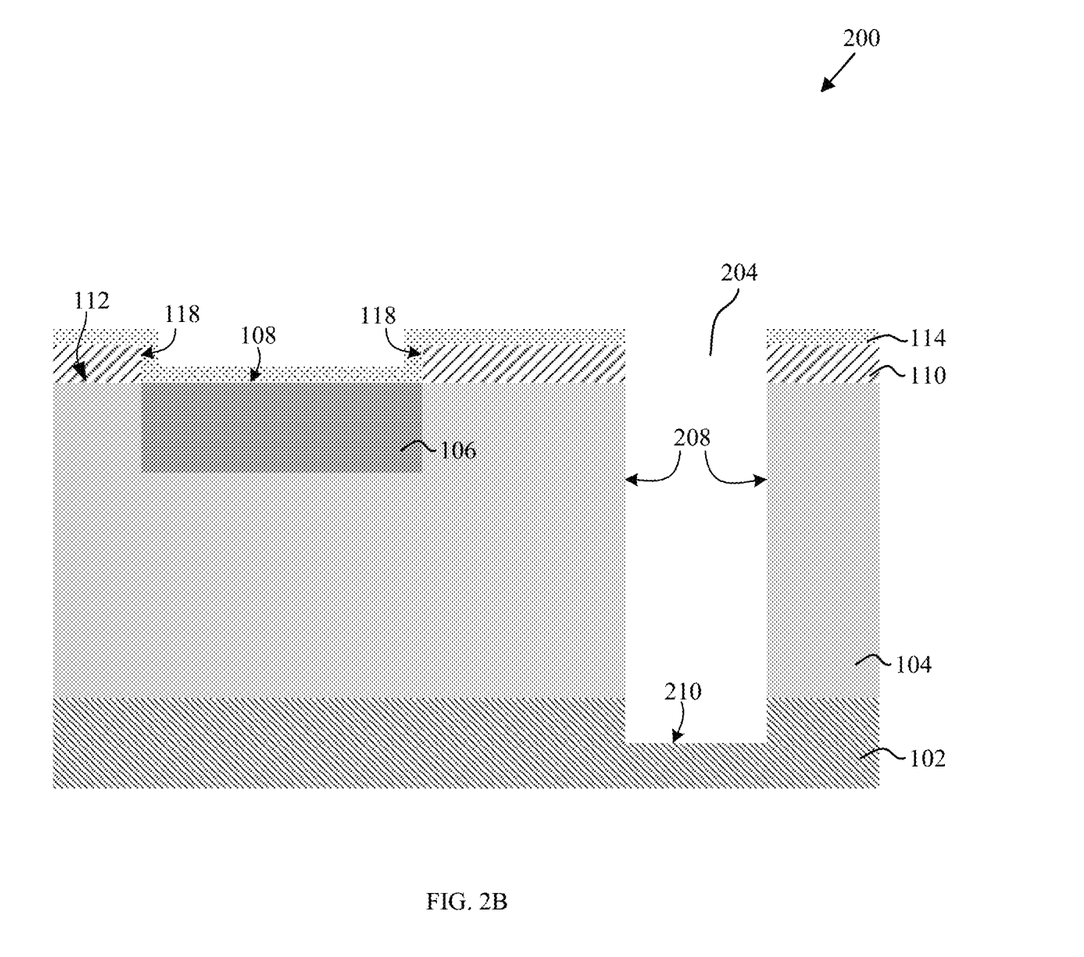

FIG. 2B illustrates the semiconductor device 200 after forming a deep trench 204 using conventional photolithographic and etching processes. The deep trench 204 having sidewalls 208 and a bottom surface 210 is formed in a scribe lane at a perimeter of the semiconductor device 200, and extended to the semiconductor substrate 102. The layer of photoresist 202 is subsequently stripped and a series of cleaning steps are performed to remove any remaining photoresist residue. The potential presence of photoresist residue remaining on the first NBLoK layer 114 is predictable even after going through the series of cleaning steps. In one embodiment of the disclosure, the deep trench 204 has a preferred width in a range of 8 to 100 um.

Figure 2C:
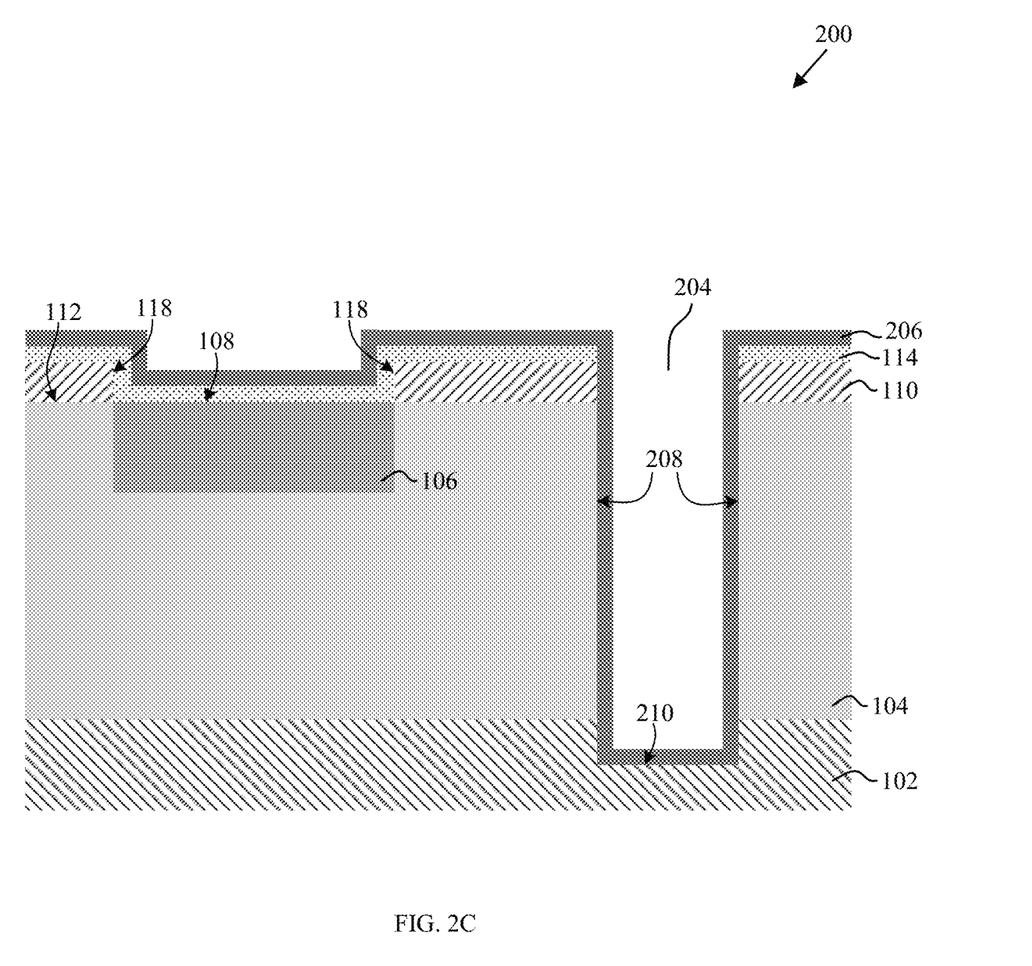

FIG. 2C illustrates the semiconductor device 200 after depositing a second NBLoK layer 206. The second NBLoK layer 206 is deposited conformally over the first NBLoK layer 114 and lining the deep trench 204, covering the sidewalls 208 and the bottom surface 210 of the deep trench 204. In one embodiment of the disclosure, the second NBLoK layer 206 is made of a dielectric material that includes silicon carbonitride (SiCN), silicon oxynitride (SiON), silicon nitride ($Si_xN_y$) or silicon oxide ($SiO_2$), wherein x and y are in stoichiometric ratio. The second NBLoK layer 206 has a preferred thickness in a range of 50 Å to 200 Å. The first and second NBLoK layers may or may not be formed of the same material. In another embodiment of the disclosure, the second NBLoK layer 206 has a preferred thickness of 70 Å.

Figure 2D:
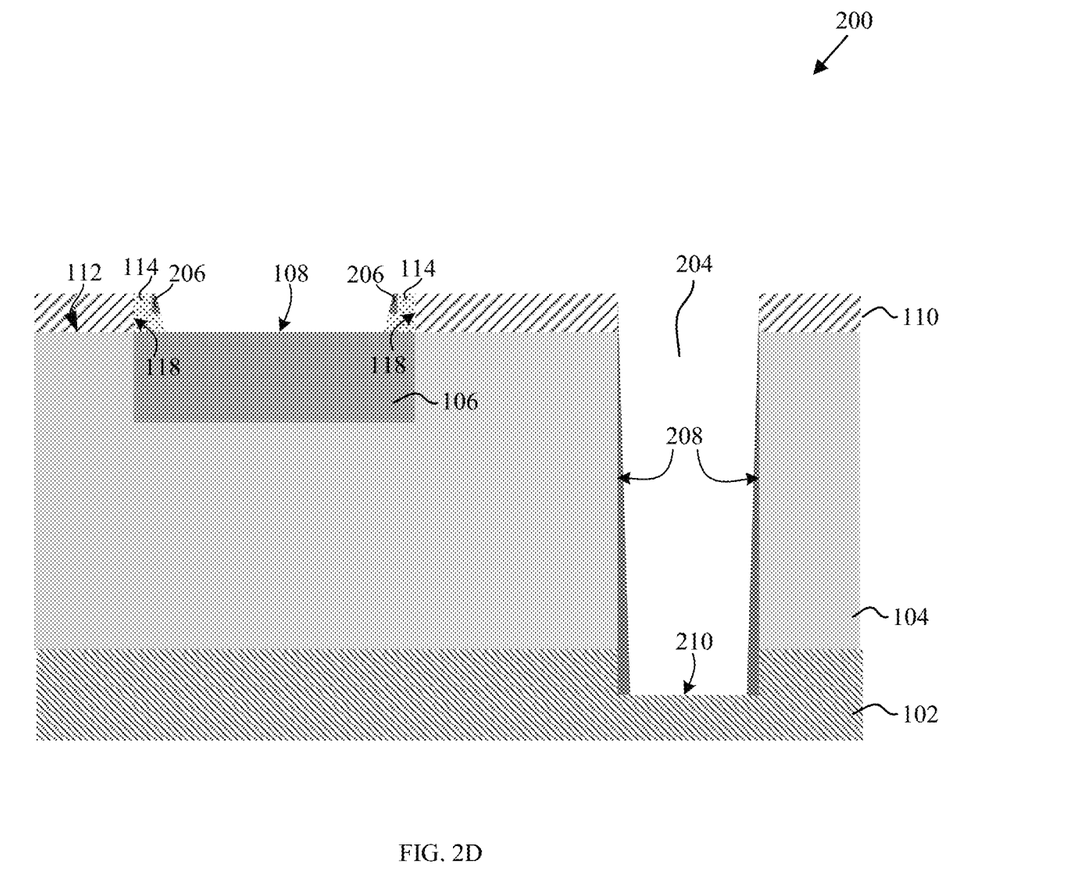

FIG. 2D illustrates the semiconductor device 200 after removing portions of the first NBLoK layer 114 and the second NBLoK layer 206. The first and second NBLoK layers (114 and 206) are removed using conventional plasma etching process, which is similarly described in FIG. 1C, exposing the upper surface 108 of the bond pad 106. Due to the intrinsic nature of the plasma etch process, both NBLoK layers (114 and 206) are removed from all upper surfaces, leaving portions of the NBLoK layers (114 and 206) on the end portions 118 of the passivation layer 110 and portions of the second NBLoK layer 206 on the sidewalls 208 of the deep trench 204. The remaining portions of the NBloK layers (114 and 206) on the end portions 118 of the passivation layer 110 have a tapered surface, wherein the tapered surface is tapered in a direction such that a lower portion of the NBLoK layers has a wider width than at an upper portion. The portions of the NBLoK layers (114 and 206) form protective caps over the end portions 118 of the passivation layer 110, sealing the formed fluorine polymers from the bond pad opening process between the end portions 118 of the passivation layer 110 and the first NBLoK layer 114. The remaining portions of the second NBloK layer 206 on the sidewalls 208 of the deep trench 204 have a tapered surface, wherein the tapered surface is tapered in a direction such that a lower portion of the NBLoK layer 206 has a wider width than at an upper portion. The portions of the second NBLoK layer 206 on the sidewalls 208 of the deep trench 204 provide mechanical protection to the semiconductor device 200 during subsequent wafer singulation process. In one embodiment of the disclosure, the portion of the NBLoK layers (114 and 206) remaining on the sidewalls 118 of the passivation opening 116 has a width in a range of 50 Å to 125 Å.

Figure 3:
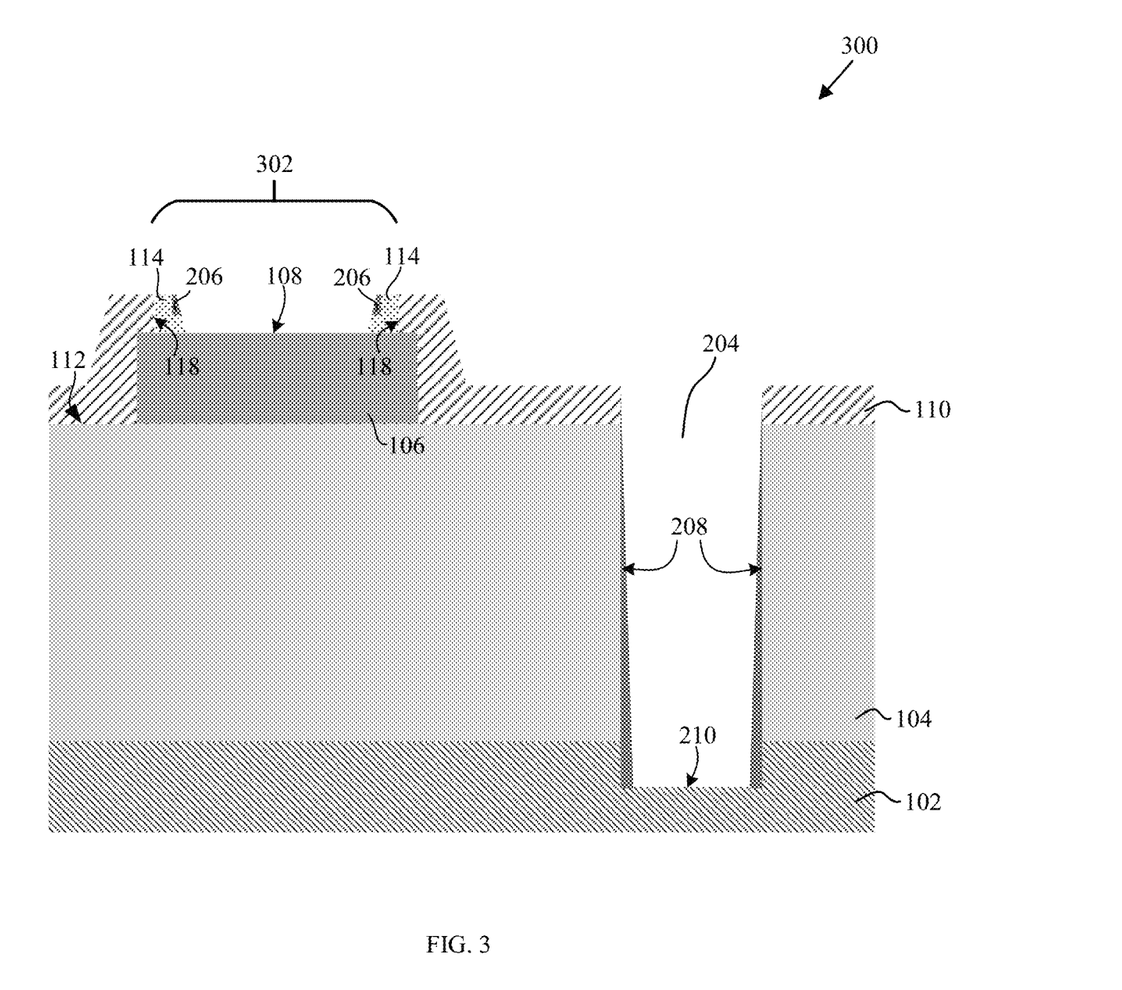
FIG. 3 is a cross-sectional view of a semiconductor device, according to yet another embodiment of the disclosure.

FIG. 3 is a cross-sectional view of a semiconductor device 300, according to yet another embodiment of the disclosure. As illustrated in FIG. 3, the bond pad 106 is formed on the upper surface 112 of the dielectric layer 104. The passivation layer 110 is deposited over the upper surface 112 of the dielectric layer 104 and over the upper surface 108 of the bond pad 106, wherein a bond pad opening 302 is defined by the end portions 118 of the passivation layer 110 over the upper surface 108 of the bond pad 106. The bond pad opening 302 may have a same width or a smaller width as the bond pad 106. The end portions 118 of the passivation layer 110 are sealed with protective caps formed of the first and second NBLoK layers (114 and 206), sealing the formed fluorine polymers from the bond pad opening process between the end portions 118 of the passivation layer 110 and the NBLoK layer 114. The sidewalls 208 of the deep trench 204 are lined with the second NBLoK layer 206, with the second NBLoK layer 206 providing mechanical protection to the semiconductor device 300 during subsequent wafer singulation process.

As presented in the above detailed description, fluorine polymers formed at end portions of passivation layer over bond pad surfaces after a bond pad opening process are sealed with a deposited NBLoK layer to prevent fluorine polymers from discharging fluorine contaminants onto bond pad surfaces. The method described also protects the bond pad surfaces by isolating the bond pad surfaces from a layer of photoresist should the semiconductor device requires further post fabrication processing, such as deep trench formation.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in one embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A semiconductor device comprising:
   a substrate;
   at least one bond pad over the substrate;
   a passivation layer having an opening over the at least one bond pad, wherein the opening is defined by end portions of the passivation layer;
   a NBLoK layer covering the end portions of the passivation layer; and
   a trench having sidewalls at a perimeter of the semiconductor device.

2. The device of claim 1, wherein the NBLoK layer is a first NBLoK layer, further comprises:
   a second NBLoK layer over the first NBLoK layer and lining the trench sidewalls.

3. The device of claim 2 wherein the first and second NBLoK layers are formed of the same material.

4. The device of claim 2, wherein the second NBLoK layer is arranged over the first NBLoK layer at the end portions of the passivation layer.

5. The device of claim 2, wherein the second NBLoK layer has a thickness in a range of 50 Å to 125 Å.

6. The device of claim 1 wherein the NBLoK layer comprises SiCN, SiON, $Si_xN_y$, or $SiO_2$.

7. The device of claim 1 wherein the NBLoK layer has a thickness in a range of 50 Å to 200 Å.

8. The device of claim 1, wherein the trench is extended to the substrate.

9. A semiconductor device comprising:
a substrate;
at least one bond pad over the substrate;
a passivation layer having an opening over the at least one bond pad, wherein the opening is defined by end portions of the passivation layer;
a cap covering the end portions of the passivation layer;
a trench with sidewalls at a perimeter of the semiconductor device; and
a NBLoK layer lining the trench sidewalls.

10. The device of claim 9 further comprises:
a dielectric layer having an upper surface over the substrate; and
the at least one bond pad having an upper surface that is coplanar with the upper surface of the dielectric layer.

11. The device of claim 9 further comprises:
a dielectric layer having an upper surface over the substrate; and
the at least one bond pad is formed on the upper surface of the dielectric layer.

12. The device of claim 9, wherein the cap covering the end portions of the passivation layer, the cap further comprises:
a first NBLoK layer and a second NBLoK layer; and
the NBLoK layer lining the trench sidewalls is formed from the second NBLoK layer.

13. The device of claim 9, wherein the NBLoK layer has a tapered surface.

14. The device of claim 9, wherein the cap has a width in range of 50 Å to 125 Å.

* * * * *